(12) United States Patent
Tsuyuki

(10) Patent No.: US 8,240,154 B2
(45) Date of Patent: Aug. 14, 2012

(54) CRYOPUMP, SPUTTERING APPARATUS, AND SEMICONDUCTOR MANUFACTURING APPARATUS

(75) Inventor: Ryosuke Tsuyuki, Tokyo (JP)

(73) Assignee: Sumitomo Heavy Industries, Ltd., Tokyo (JP)

( * ) Notice: Subject to any disclaimer, the term of this patent is extended or adjusted under 35 U.S.C. 154(b) by 1526 days.

(21) Appl. No.: 11/783,460

(22) Filed: Apr. 10, 2007

(65) Prior Publication Data
US 2007/0295599 A1    Dec. 27, 2007

(51) Int. Cl.
*B01D 8/00*    (2006.01)
(52) U.S. Cl. .......................................... 62/55.5; 62/51.1
(58) Field of Classification Search .................... 62/55.5, 62/51.1
See application file for complete search history.

(56) References Cited

U.S. PATENT DOCUMENTS

| | | | | |
|---|---|---|---|---|
| 3,133,422 | A * | 5/1964 | Paivanas et al. | 62/48.3 |
| 6,620,250 | B2 * | 9/2003 | Brezoczky et al. | 118/715 |
| 7,348,777 | B2 * | 3/2008 | Jiang et al. | 324/318 |
| 2007/0144185 | A1 * | 6/2007 | Tanaka | 62/55.5 |

FOREIGN PATENT DOCUMENTS

| | | |
|---|---|---|
| JP | 05-312149 A | 11/1993 |
| WO | WO 2005/050018 A1 | 6/2005 |

OTHER PUBLICATIONS

English Translation of WO 2005/050018.*

* cited by examiner

*Primary Examiner* — Allen Flanigan
*Assistant Examiner* — Indrajit Ghosh
(74) *Attorney, Agent, or Firm* — Rader, Fishman & Grauer PLLC

(57) ABSTRACT

A cryopump includes a thermal shield where a first condensing panel is provided; and a cryocooler connected to the thermal shield; wherein the thermal shield is divided into a plurality of members including a first member and a second member; the first member forms a thermal path between the first condensing panel and the cryocooler; the second member does not form the thermal path; the first member is made of a material having a thermal conductivity higher than a thermal conductivity of a material of the second member; and a material, having a heat capacity smaller than a heat capacity of the first member in a case where the heat capacity of the first member and the heat capacity of the second member are compared with each other under the conditions of the same volumes, is used as the material of the second member.

10 Claims, 5 Drawing Sheets

FIG.6

| HEAT LOAD (W) | COMPARISON EXAMPLE 1 | COMPARISON EXAMPLE 2 | EXAMPLE OF PRESENT INVENTION |
|---|---|---|---|
| 5 | 111.7 | 106.8 | 107.8 |
| 15 | 134.2 | 118.8 | 126.1 |
| 30 | 171.7 | 137.4 | 144.4 |

US 8,240,154 B2

CRYOPUMP, SPUTTERING APPARATUS, AND SEMICONDUCTOR MANUFACTURING APPARATUS

BACKGROUND OF THE INVENTION

1. Field of the Invention

The present invention generally relates to cryopumps, sputtering apparatuses, and semiconductor manufacturing apparatuses. More specifically, the present invention is related to a cryopump used to form a vacuum inside of a vacuum chamber, such as a processing chamber, a sputtering apparatus using the cryopump, and a semiconductor manufacturing apparatus having the cryopump.

2. Description of the Related Art

Conventionally and continuously, a multistage type cryopump has been used as a vacuum pump for forming an oil-less and clean vacuum state for manufacturing an LSI (large scale integrated circuit), a VLSI (very large scale integrated circuit), or the like.

Such a cryopump is connected to a vacuum chamber such as a processing chamber where process gas flows. The cryopump absorbs and condenses gas in the vacuum chamber on a cryogenic surface so that the vacuum state is formed. See Japanese Laid-Open Patent Application Publication No. 5-312149.

FIG. 1 is a partial cross-sectional view of a related art cryopump using a cooling storage type cryocooler.

As shown in FIG. 1, a cryopump includes a two-stage type GM (Gifford-McMahon) cycle cryocooler 51 (hereinafter "cryocooler 51") and a helium compressor 52. The helium compressor 52 is connected to the cryocooler 51 via a gas tube 53. A low temperature part of the cryocooler 51 is inserted in an adiabatic vacuum external cylinder 61. In addition, a vacuum chamber such as a processing chamber not shown in FIG. 1 is connected to the adiabatic vacuum external cylinder 61.

The cryocooler 51 includes a first cooling stage 54 and a second cooling stage 55.

A first condensing panel 56 as a first cooling panel is provided at the first cooling stage 54. Louvers 60 are provided at the first condensing panel 56 at an upper part of the cryopump 58 with a gap. The first condensing panel 56 and the louvers 60 are cooled at, for example, approximately 80 K, so that a gas composition having a relatively high freezing point (solidifying point), such as moisture or carbon dioxide gas in the vacuum chamber, is condensed.

A cryopanel 58 is provided at the second cooling stage 55 and cooled at, for example, approximately 20 K. Because of this, gas having a lower freezing point (solidifying point), such as nitrogen or argon in the vacuum chamber, is condensed at the cryopanel 58. In addition, in order to form an ultra-high vacuum, it is necessary to discharge hydrogen or helium having a further lower freezing point (solidifying point). In this case, activated carbon 59 is adhered to a part of the cryopanel 58. The activated carbon 59 absorbs gas such as hydrogen or helium.

In addition, the cryopanel 58 where the gas composition is accumulated by condensation or absorption is regenerated at a desirable time. This regeneration is implemented by, for example, increasing temperatures of the first condensing panel 56 and the cryopanel 58 to designated temperatures and discharging the gas which is condensed and absorbed from the cryopanel 58. A time for cooling in order to increase the vacuum again after this is called "cooling down time".

However, in the related art cryopump, the first condensing panel 56 is made of a single material. Normally, the first condensing panel 56 is made of copper (Cu) or aluminum (Al).

In a case where the first condensing panel 56 is made of copper (Cu), the heat capacity is larger than that in a case where the thermal shield is made of aluminum (Al). Therefore, a long cooling down time is required at the time of regeneration and therefore it is not possible to implement regeneration with high efficiency.

Details of this are discussed below. The thermal capacity is a quantity of heat required when the temperature of a material is increased by 1° C., and is the product of mass multiplied by specific heat in a case of a uniform material.

Assuming that the temperature of the thermal shield is 300 K; the volume of the thermal shield is V ($cm^3$); the specific heat of copper (Cu) is 400 (J/KgK); the specific heat of aluminum (Al) is 900 (J/KgK); the density of copper (Cu) is $8.96 \times 10^{-3}$ ($Kg/cm^3$); and the density of aluminum (Al) is $2.69 \times 10^{-3}$ ($Kg/cm^3$), the thermal capacity of copper (Cu) is V ($cm^3$)×$8.96 \times 10^{-3}$ ($Kg/cm^3$)×400 (J/KgK)=3.584×V (J/K). In this case, the thermal capacity of aluminum (Al) is V ($cm^3$)×$2.69 \times 10^{-3}$ ($Kg/cm^3$)×900 (J/KgK)=2.42×V (J/K).

Thus, in the case where the first condensing panel 56 is made of copper, the heat capacity is larger than that in the case where the first condensing panel 56 is made of aluminum (Al).

On the other hand, in the case where the first condensing panel 56 is made of aluminum (Al), the temperature gradient between the first cooling stage 54 of the cryocooler 51 and the louvers 60 is high.

In other words, since the coefficient of thermal conductivity of aluminum (Al) is lower than that of copper (Cu), for example, high temperature process gas comes in contact with the louver 60 so that the temperature of the louver 60 is increased and therefore the cooling effect generated at the first cooling stage 54 of the cryocooler 51 is not extended to the louver 60.

Because of this, the louver 60 cannot be cooled, efficiently and the gas composition in the vacuum chamber which should be absorbed by the louvers 60 reaches the cryopanel 58 without sufficient condensation.

As a result of this, the condensation and absorption of the gas composition by the cryopanel 58 are not implemented efficiently and therefore it may be not possible to make the vacuum chamber have a desirable vacuum degree.

SUMMARY OF THE INVENTION

Accordingly, embodiments of the present invention may provide a novel and useful cryopump, sputtering apparatus, and semiconductor manufacturing apparatus solving one or more of the problems discussed above.

More specifically, the embodiments of the present invention may provide a cryopump whereby a time for cooling down (a cooling down time) can be decreased and it is possible to make a vacuum chamber have a desirable vacuum degree, a sputtering apparatus having the cryopump, and a semiconductor manufacturing apparatus having the cryopump.

One aspect of the present invention may be to provide a cryopump, including a thermal shield where a first condensing panel 56 is provided; and a cryocooler connected to the thermal shield; wherein the thermal shield is divided into a plurality of members including a first member and a second member; the first member forms a thermal path between the first condensing panel and the cryocooler; the second member does not form the thermal path; the first member is made of a material having a thermal conductivity higher than a thermal conductivity of a material of the second member; and a material, having a heat capacity smaller than a heat capacity of the first member in a case where the heat capacity of the first member and the heat capacity of the second member are compared with each other under the conditions of the same volumes, is used as the material of the second member.

Another aspect of the present invention may be to provide a sputtering apparatus, including a cryopump, the cryopump including a thermal shield where a first condensing panel 56 is provided; and a cryocooler connected to the thermal shield; wherein the thermal shield is divided into a plurality of members including a first member and a second member; the first member forms a thermal path between the first condensing panel and the cryocooler; the second member does not form the thermal path; the first member is made of a material having a thermal conductivity higher than a thermal conductivity of a material of the second member; and a material, having a heat capacity smaller than a heat capacity of the first member in a case where the heat capacity of the first member and the heat capacity of the second member are compared with each other under the conditions of the same volumes, is used as the material of the second member.

Another aspect of the present invention may be to provide a semiconductor manufacturing apparatus including a cryopump, the cryopump including a thermal shield where a first condensing panel 56 is provided; and a cryocooler connected to the thermal shield; wherein the thermal shield is divided into a plurality of members including a first member and a second member; the first member forms a thermal path between the first condensing panel and the cryocooler; the second member does not form the thermal path; the first member is made of a material having a thermal conductivity higher than a thermal conductivity of a material of the second member; and a material, having a heat capacity smaller than a heat capacity of the first member in a case where the heat capacity of the first member and the heat capacity of the second member are compared with each other under the conditions of the same volumes, is used as the material of the second member.

Other objects, features, and advantages of the present invention will become more apparent from the following detailed description when read in conjunction with the accompanying drawings.

BRIEF DESCRIPTION OF THE DRAWINGS

FIG. 6 is a table showing temperature change of louvers provided at the cryopump of the embodiment of the present invention, with comparison to the conventional art.

DETAILED DESCRIPTION OF THE PREFERRED EMBODIMENTS

A description is given below, with reference to the FIG. 2 through FIG. 6 of embodiments of the present invention.

Figure 2:
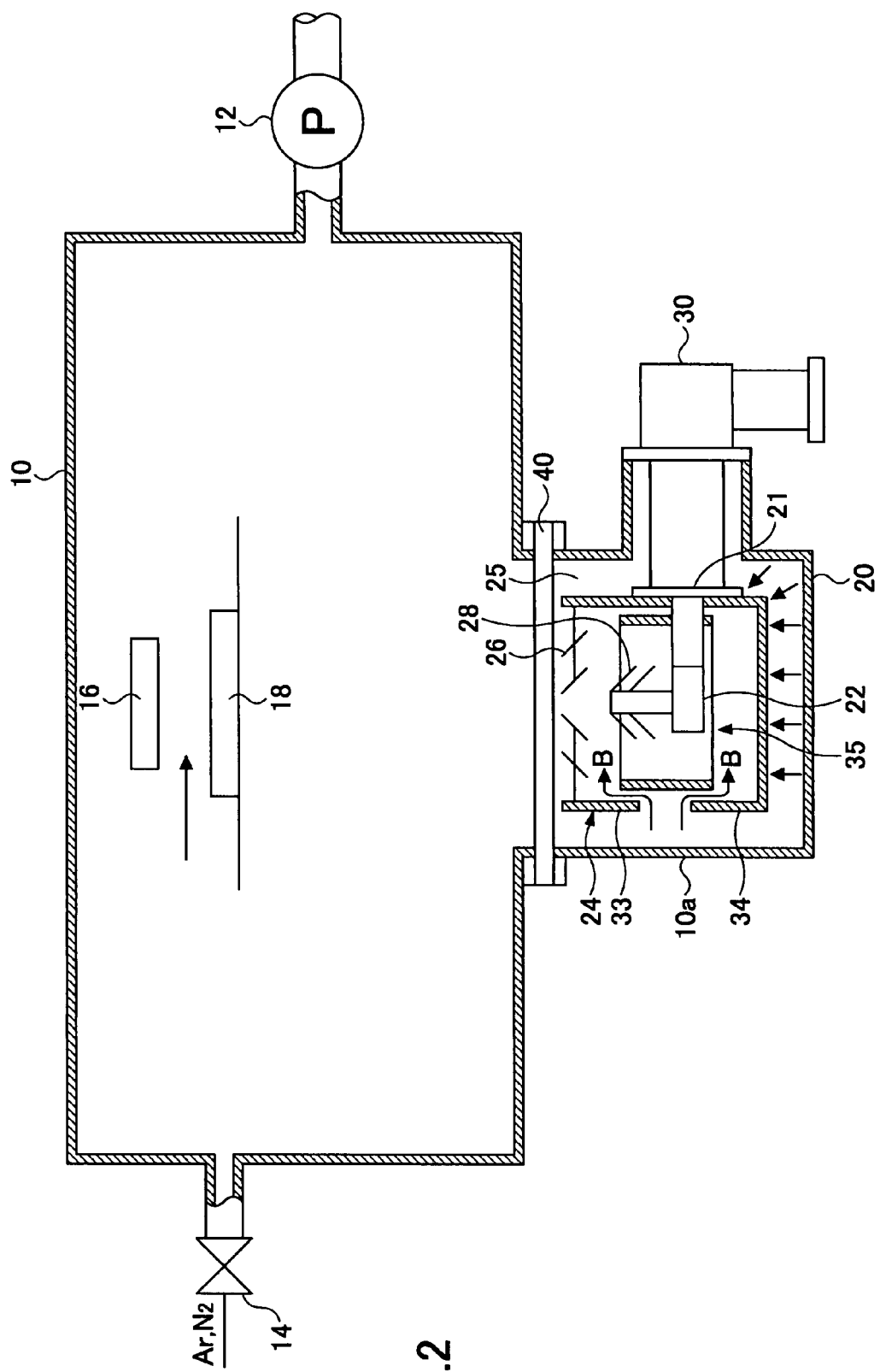
FIG. 2 is a partial cross-sectional view of a semiconductor manufacturing apparatus using a cryopump of an embodiment of the present invention.

FIG. 2 is a partial cross-sectional view of a semiconductor manufacturing apparatus using a cryopump 20 of an embodiment of the present invention.

First, a structure of the semiconductor manufacturing apparatus and process steps using the semiconductor manufacturing apparatus for a wafer 18 are discussed, and then the cryopump 20 is discussed.

The semiconductor manufacturing apparatus shown in FIG. 2 includes a processing chamber 10. The processing chamber 10 is formed in an airtight manner and connects to a roughing vacuum pump 12, a cryopump 20, and a process gas supplying opening 14. The roughing vacuum pump 12 is a mechanical rotary pump.

A target 16 and a wafer 18 are provided inside the processing chamber 10 for implementing a process such as a sputtering process.

The process steps using this semiconductor manufacturing apparatus for the wafer 18 are as follows.

First, a rough vacuum is formed inside the vacuum chamber 10*a* by using the roughing vacuum pump 12 at approximately 1 Pa. If a certain degree or higher vacuum is not formed, the cryopump 20 cannot perform cooling because the amount of heat conduction from the outside that is at room temperature is large due to the thermal conductivity of (heat transfer by) gas molecules. Because of this, a vacuum should be formed in the vacuum chamber 10*a* by using the roughing vacuum pump 12.

More specifically, the processing chamber 10 and the vacuum chamber 10*a* are separated by a gate valve 40 as shown in FIG. 2. After that, a rough vacuum is formed in the vacuum chamber 10*a* by using the roughing vacuum pump 12.

Next, the cryopump 20 is operated so that the inside of the vacuum chamber 10*a* is at a high vacuum of approximately $10^{-7}$ Pa and the gate valve 40 is opened.

The cryopump 20 cools the louvers 26, the cryopanel 28, and others at a temperature equal to or lower than a freezing point (solidifying point) of the gas molecules, so that a high vacuum is realized by condensing and freezing (solidifying) the gas molecules or absorbing the gas molecules due to cooling of the activated carbon. Here, the cryopanel 28 is called a two-stage panel because the cryopanel 28 is connected to a second (cooling) stage 22.

If the inside of the vacuum chamber 10*a* reaches a high vacuum of approximately $10^{-7}$ Pa due to the cryopump 20, in order to implement the sputtering operations, process gas such as Argon (Ar) or nitrogen ($N_2$) is supplied from a process gas supplying opening 14 into the processing chamber 10.

Next, the structure of the above-discussed cryopump 20 is discussed.

The cryopump 20 is connected to the processing chamber 10. It is general practice to use a two-stage type GM (Gifford-McMahon) cryocooler 30 for the cryopump 20. A second (cooling) stage 22 is covered by providing the thermal shield 24 at the first (cooling) stage 21 having high temperature.

The thermal shield 24 is used for shielding heat of radiation from the outside that is at room temperature and prevents transferring heat to the second stage 22. In addition, in the entrance for the gas molecules, the louver 26 or the like is provided at the head end of the thermal shield 24.

Furthermore, the louvers 26 are connected to the thermal shield 24 and cooled via the thermal shield 24. Because of this, the gas molecules having a relatively high freezing (solidifying) temperature, especially $H_2O$, are condensed by the louver 26 before reaching the cryopanel 28.

On the other hand, since the second stage 22 is cooled at approximately 10 K, the cryopanel 28 is also cooled at the same temperature so that oxygen or nitrogen is condensed.

In addition, the activated carbon provided at the cryopanel 28 is cooled so that gas is absorbed in minute pores of the activated carbon.

As a result of this, the gas molecules in the processing chamber 10 are condensed and absorbed so as to be reduced and therefore the inside of the processing chamber 10 can be made be in a high vacuum.

Figure 1:
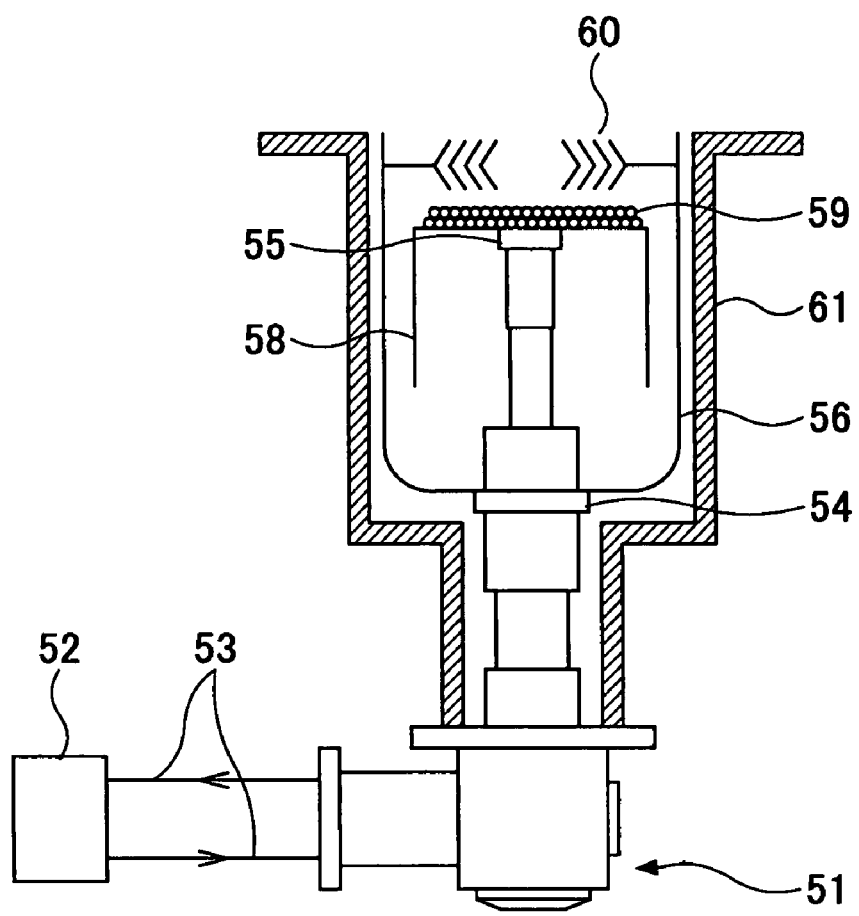
FIG. 1 is a partial cross-sectional view of a related art cryopump using a cooling storage type cryocooler.
Figure 3:
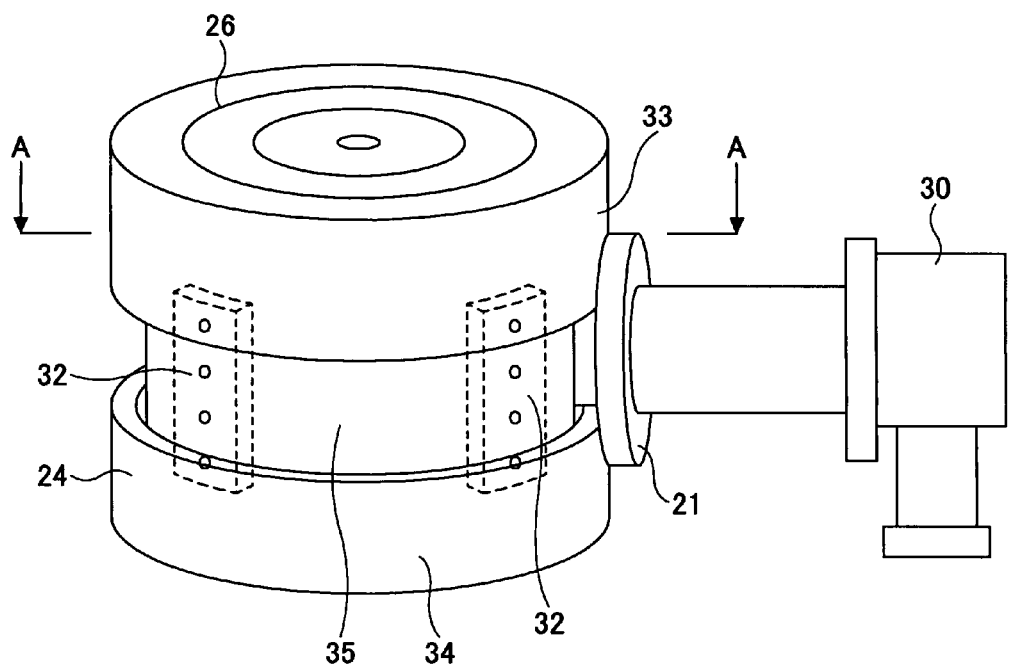
FIG. 3 is a enlarged perspective view of a thermal shield of the cryopump of the embodiment of the present invention.
Figure 4:
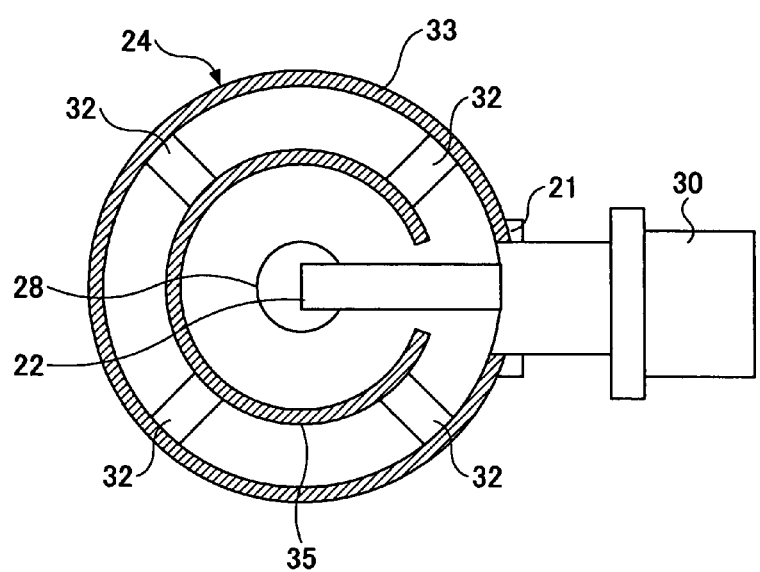
FIG. 4 is a cross-sectional view taken along a line A-A of FIG. 3.

Here, the structure of the thermal shield 24 is discussed with reference FIG. 1, FIG. 2 and FIG. 3. FIG. 3 is an enlarged perspective view the thermal shield 24 of the cryopump 20 of the embodiment of the present invention. FIG. 4 is a cross-sectional view taken along a line A-A of FIG. 3.

As discussed above, in the related art (see FIG. 1), the first condensing panel 56 is made of a single material of copper (Cu) or aluminum (Al). Therefore, in the case where the first condensing panel 56 is made of copper (Cu), since the heat capacity is large, the cooling down time is long. In the case where the first condensing panel 56 is made of aluminum (Al), the temperature gradient is high so that the temperature of the louver 60 is increased due to the thermal load.

On the other hand, in the embodiment of the present invention, the thermal shield 24 is divided into plural shield members.

More specifically, in the embodiment of the present invention, the thermal shield 24 is divided into three members, namely a first shield member 33, a second shield member 34, and a third shield member 35.

The first shield member 33 forms a thermal path between the louvers 26 and the cryocooler 30. The first shield member 33 is provided at an upper part of the thermal shield 24 and is in a body with the louvers 26.

The first shield member 33 is thermally connected to the first stage 21 so that the first shield member 33 and the louvers 26 are cooled at approximately 80 K by driving the cryocooler 30.

In addition, in the embodiment of the present invention, the first shield member 33 is made of copper (Cu) having a thermal conductivity higher than that of aluminum (Al) that is the material of the first and third shield members 34 and 35 discussed below.

Coefficients of thermal conductivity of copper (Cu) and aluminum (Al) are shown in table 1 below by comparing them with each other.

TABLE 1

| Temp. (K) | Cu (W/mK) | AL (W/mK) |
|---|---|---|
| 300 | 300 | 150 |
| 200 | 300 | 160 |
| 100 | 460 | 220 |
| 20 | 1300 | 225 |

The second shield member 34 mainly performs an original function as the thermal shield 24. The second shield member 34 blocks heat of radiation from the outside that is at room temperature and prevents heat being transferred to the second stage 22. The second shield member 34, unlike the first shield member 33, is made of aluminum (Al).

In addition, the second shield member 34 is situated in a position separated from the first shield member 33 downward. Furthermore, the second shield member 34 is connected to the first stage 21 of the cryocooler 30. Accordingly, the second shield member 34 is cooled at approximately 80 K by driving the cryocooler 30.

The third shield member 35 is fixed to the inside of the first shield member 33 and the second shield member 34 separated from each other by block-shaped supporting members 32 shown in FIG. 3 and FIG. 4.

The third shield member 35 prevents entry of the heat of radiation and allows the gas molecules in the vacuum chamber 10a to flow inside the thermal shield 24. The flow of the gas molecules is shown by an arrow B in FIG. 2.

The third shield member 35 is made of aluminum (Al) and provided to surround the second stage 22 and the cryopanel 28 as shown in FIG. 4.

Here, functions of the third shield member 35 are discussed in comparison with those of the unified thermal shield of the related art.

Assuming that the thermal shield is unified, in a case where the gas molecules (process gas) of argon (Ar), nitrogen ($N_2$), or the like enter a space 25 formed between the vacuum chamber 10a and the thermal shield, heat transfer, from the outside that is at room temperature to the thermal shield may be generated due to the gas molecules. In this case, the temperature of the thermal shield is increased so that the gas molecules may not be condensed at the louver 26.

On the other hand, in the embodiment of the present invention, in order to directly shield against light, a third shield member is provided inside the first shield member 33 and the second shield member 34. Therefore, heat of radiation is blocked by the third shield member 35 so as to prevent the heat of radiation from entering inside the thermal shield 24.

In addition, in a case where the gas molecules such as argon (Ar), nitrogen ($N_2$), or the like are in the space 25, the gas molecules flow from the separation part between the first shield member 33 and the second shield member 34 into the thermal shield 24. The flow of the gas molecules is shown by an arrow B in FIG. 2.

The gas molecules flowing in the thermal shield 24 are condensed by the cryopanel 28 cooled by the cryocooler 30. Therefore, it is possible to prevent the temperature of the thermal shield 24 from being increased.

Next, action and effect of the structure differ where the first shield member 33 and the second shield member 34 are separately provided on the thermal shield 24.

As discussed above, the first shield member 33 where the louvers 26 are provided in a uniform manner is made of copper (Cu). The second shield member 34 shielding the heat of radiation from the outside that is at room temperature is made of aluminum (Al).

Thus, since the first shield member 33 and the second shield member 34 are formed by materials different from each other, the thermal shield 24 has a divided structure.

The material of the first shield member 33, namely copper (Cu), has a thermal conductivity higher than that of the material of the second shield member 34, namely aluminum (Al). In addition, aluminum (Al) has a heat capacity smaller than that of copper (Cu) under the conditions of the same volumes.

In other words, in the thermal shield 24 of the embodiment of the present invention, a material having heat conductivity higher than that of the material of the second shield member 34 is used as the material of the first shield member 33. In addition, a material having a heat capacity smaller than that of the material of the first shield member 33 is used as the material of the second shield member 34.

Under this structure, since the material having a heat conductivity higher than that of the material of the second shield member 34 is used for the first shield member 33 forming the thermal path between the louvers 26 and the cryocooler 30 (the first stage 21), it is possible to make the temperature gradient between the louvers 26 and the cryocooler 30 low. Therefore, the louver 26 can endure the thermal load such as applied by process gas.

Because of this, the gas molecules having a relatively high freezing (solidifying) temperature, especially $H_2O$, are condensed by the louver 26 before reaching the cryopanel 28 so that reaching the cryopanel 28 can be prevented.

In addition, since the second shield member 34 is separated from the louvers 26, it is not necessary to form the thermal path from the cryocooler 30 to the louvers 26. However, the material having a heat capacity smaller than that of the material of the first shield member 33 under the conditions of the same volumes is used as the material of the second shield member 34.

Because of this, it is possible to decrease the cooling down time at the time of regeneration of the cryopump 20. Therefore, it is possible to increase the operating rate of the cryopump 20. While the example using the louver 26 as the first stage condensing panel is discussed, the first stage condensing panel may include chevrons or baffles.

In addition, in the embodiment of the present invention, the cryocooler 30 is connected to the side part of the thermal shield 24. According to this structure, as compared to a structure where the cryocooler is connected to the bottom part of the thermal shield (see FIG. 1), it is possible to shorten the thermal path between the louvers 26 and the cryocooler 30 and therefore, it is possible to cool the louvers 26 efficiently.

Figure 5:
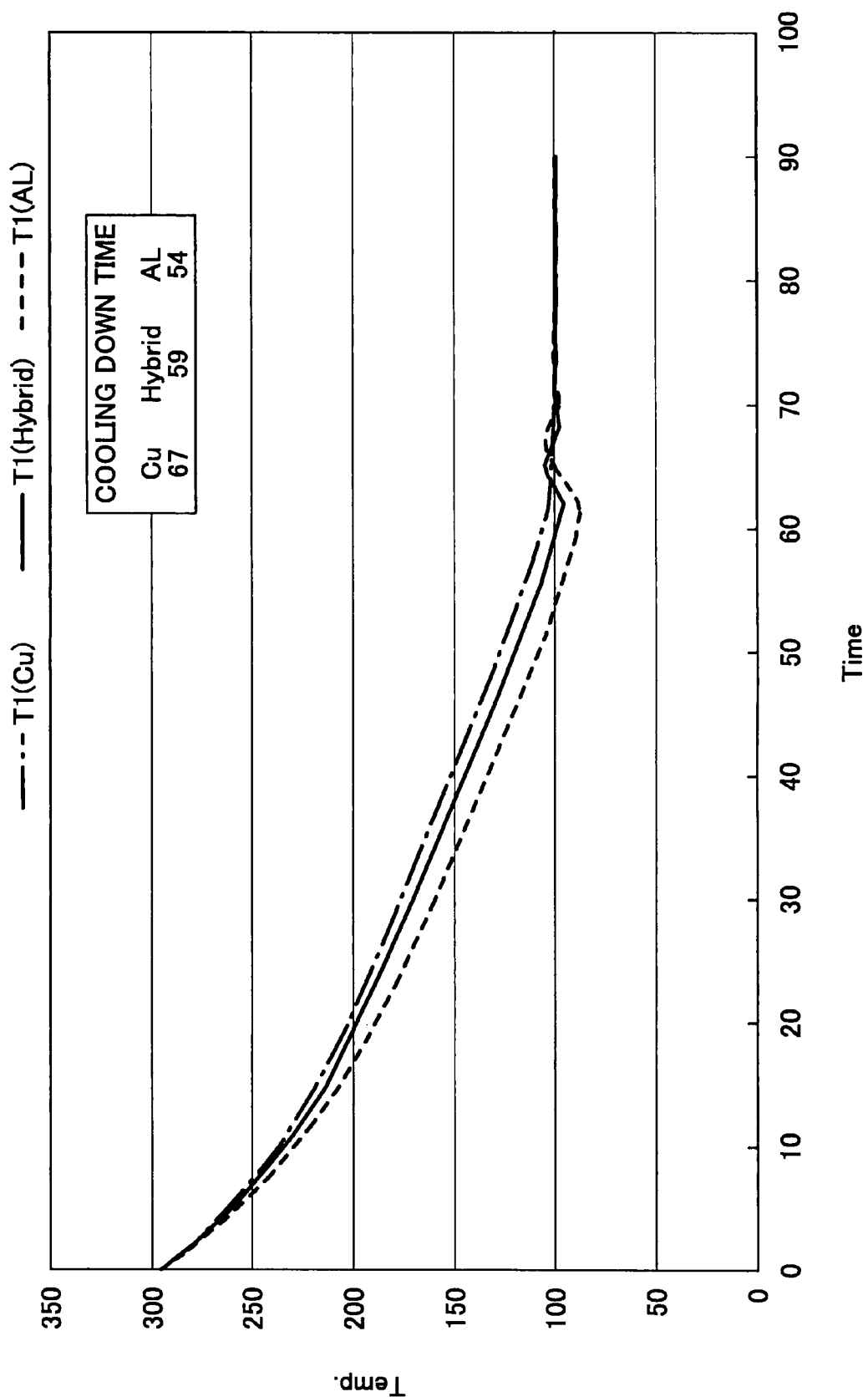
FIG. 5 is a graph showing temperature change of the thermal shield at a cooling down time of the cryopump of the embodiment of the present invention, with comparison to the conventional art.

FIG. 5 and FIG. 6 are views for explaining effects of the cryopump 20 of the embodiment of the present invention.

More specifically, FIG. 5 is a graph showing temperature change of the thermal shield 24 at a cooling down time of the cryopump 20 of the embodiment of the present invention, with comparison to the conventional art.

The vertical axis of the graph indicates the temperature of the thermal shield 24 and the horizontal axis of the graph indicates time.

In addition, a solid line in the graph indicates characteristics of the cryopump 20 where the thermal shield 24 is formed by the first shield member 33 made of copper (Cu) and the second shield member 34 made of aluminum (Al). A one dotted line indicates characteristics of a cryopump where the entirety of the thermal shield is made of copper (Cu). A dashed line indicates characteristics of a cryopump where the entirety of the thermal shield is made of aluminum (Al).

Furthermore, the cooling down time is a time when the temperature reaches 100 K.

As shown in FIG. 5, the cooling down time of the cryopump 20 of the embodiment of the present invention is 59 minutes. The cooling down time of the cryopump where the entirety of the thermal shield is made of copper (Cu) is 67 minutes. The cooling down time of the cryopump where the entirety of the thermal shield is made of aluminum (Al) is 54 minutes.

Therefore, as shown in FIG. 5, it is proved that while the cooling down time of the cryopump of the embodiment of the present invention is slower than that of the cryopump where the entirety of the thermal shield is made of aluminum (Al), the cooling down time of the cryopump of the embodiment of the present invention is much shorter than that of the cryopump where the entirety of the thermal shield is made of copper (Cu).

FIG. 6 is a table showing temperature change of the louvers 26 provided at the cryopump 20 of the embodiment of the present invention, with comparison to the conventional art. More specifically, FIG. 6 shows the results of simulation in a case where the heat input of the process gas (gas molecules) is virtually determined and applied to the louvers 26.

In FIG. 6, the column of the "example of the present invention" indicates the result of the simulation of the cryopump 20 of the embodiment of the present invention. The column of the "comparison example 1" indicates the result of the simulation of a cryopump where the entirety of the thermal shield is made of aluminum (Al). The column of the "comparison example 2" indicates the result of the simulation of a cryopump where the entirety of the thermal shield is made of copper (Cu).

In any case, the louvers are made of copper (Cu) and 5 W, 15 W, and 30 W are set as thermal loads. In addition, the point of temperature measurement is a center point of the louvers.

As shown in FIG. 6, in each of the thermal loads, the temperature of the louvers 26 of the cryopump 20 of the embodiment of the present invention is between the temperature of the louvers of the cryopump where the entirety of the thermal shield is made of aluminum (Al) and the temperature of the louvers of the cryopump where the entirety of the thermal shield is made of copper (Cu). More specifically, it is found that the characteristics of the cryopump 20 of the embodiment of the present invention are close to the characteristics of the cryopump where the entirety of the thermal shield is made of copper (Cu).

This is because the first shield member 33, as well as the louvers 26 are made of copper (Cu) having a high thermal conductivity. Therefore, the heat applied to the louvers 26 is conducted to the first shield member 33 and transferred away by the first stage 21. Hence, it is possible to keep the temperature of the louvers 26 low.

Accordingly, by using the cryopump 20 of the embodiment of the present invention, the gas molecules having a relatively high temperature for freezing (solidifying) are securely condensed by the louvers 26. Therefore, it is possible to maintain a high vacuum state with the cryopump 20.

Thus, according to the above-discussed embodiments of the present invention, it is possible to provide a cryopump 20 including a thermal shield 24 where a first condensing panel 56 is provided; and a cryocooler 51 connected to the thermal shield 24; wherein the thermal shield 24 is divided into a plurality of members including a first member and a second member; the first member forms a thermal path between the first condensing panel 56 and the cryocooler 51; the second member does not form the thermal path; the first member is made of a material having a thermal conductivity higher than a thermal conductivity of a material of the second member; and a material, having a heat capacity smaller than a heat capacity of the first member in a case where the heat capacity of the first member and the heat capacity of the second member are compared with each other under the conditions of the same volumes, is used as the material of the second member.

Since the first member is made of the material having the thermal conductivity higher than a thermal conductivity of the material of the second member, even if there is thermal load, it is possible to make the temperature gradient between the first condensing panel 56 and the cryocooler 51 low. Hence, it is possible to prevent the temperature of the first condensing panel 56 increasing.

In addition, since the material, having the heat capacity smaller than the heat capacity of the first member in the case where the heat capacity of the first member and the heat capacity of the second member are compared with each other under the conditions of the same volumes, is used as the material of the second member, it is possible to decrease the cooling down time at the time of regeneration of the cryopump 20.

The first member may include copper; and the second member may include aluminum.

Copper has a thermal conductivity higher than that of aluminum. In addition, aluminum has a smaller heat capacity than copper under the conditions of the same volume. Therefore, since the first member includes copper and the second member includes aluminum, even if there is a thermal load due to the processing gas, it is possible to prevent the increase of temperature of the first condensing panel 56 and realize the cryopump 20 having a short cooling down time.

A third member may be provided between the first member and the second member; and the third member may prevent entry of a heat of radiation and allow gas molecules to flow inside the thermal shield 24.

According to the above-mentioned structure, by providing the third member, it is possible for the gas molecules existing outside of the thermal shield 24 to flow inside the thermal shield 24 so that the gas molecules are condensed and solidified (frozen) by the cryocooler 51.

Therefore, by making the vacuum degree of a gap between the vacuum chamber and the thermal shield 24 high, heat transfer by the gas molecules from the outside that is at room temperature to the thermal shield 24 does not happen. Hence, the temperature of the thermal shield 24 is not increased.

In addition, the third member prevents entry of the radiation heat so that input heat transfer to the cryocooler 51 is prevented.

The cryocooler 51 may be connected to a side part of the thermal shield 24.

According to the above-mentioned structure, as compared to a structure where the cryocooler 51 is connected to a bottom part of the thermal shield 24, it is possible to shorten the thermal path between the louvers and the cryocooler 51, and thereby it is possible to efficiently cool the louvers.

According to the above-discussed embodiments of the present invention, it is also possible to provide a sputtering apparatus including a cryopump 20, the cryopump 20 including a thermal shield 24 where a first condensing panel 56 is provided; and a cryocooler 51 connected to the thermal shield 24; wherein the thermal shield 24 is divided into a plurality of members including a first member and a second member; the first member forms a thermal path between the first condensing panel 56 and the cryocooler 51; the second member does not form the thermal path; the first member is made of a material having a thermal conductivity higher than a thermal conductivity of a material of the second member; and a material, having a heat capacity smaller than a heat capacity of the first member in a case where the heat capacity of the first member and the heat capacity of the second member are compared with each other under the conditions of the same volumes, is used as the material of the second member.

According to the above-discussed embodiments of the present invention, it is also possible to provide a semiconductor manufacturing apparatus including a cryopump 20, the cryopump 20 including a thermal shield 24 where a first condensing panel 56 is provided; and a cryocooler 51 connected to the thermal shield 24; wherein the thermal shield 24 is divided into a plurality of members including a first member and a second member; the first member forms a thermal path between the first condensing panel 56 and the cryocooler 51; the second member does not form the thermal path; the first member is made of a material having a thermal conductivity higher than a thermal conductivity of a material of the second member; and a material, having a heat capacity smaller than a heat capacity of the first member in a case where the heat capacity of the first member and the heat capacity of the second member are compared with each other under the conditions of the same volumes, is used as the material of the second member.

Thus, according to the above-discussed embodiments of the present invention, it is possible to cool the louver quickly and precisely and the time for cooling down (a cooling down time) at the time of regeneration of the cryopump 20 can be decreased.

The present invention is not limited to these embodiments, but variations and modifications may be made without departing from the scope of the present invention.

For example, the present invention can be applied to not only the sputtering apparatus or the semiconductor manufacturing apparatus but also any apparatus wherein the cryopump 20 is operated by a gas process.

What is claimed is:

1. A cryopump, comprising:
a thermal shield having a first condensing panel; and
a cryocooler connected to the thermal shield;
wherein the thermal shield is divided into a plurality of members including a first member fabricated from a single first material and a second member fabricated from a single second material different from the first material;
the first member forms a thermal path between the first condensing panel and the cryocooler;
the second member does not form the thermal path;
the first material having a thermal conductivity higher than the second material and the first material has a higher heat capacity than the second material.

2. The cryopump as claimed in claim 1, wherein the first material includes copper; and the second material includes aluminum.

3. The cryopump as claimed in claim 2, wherein a third member is provided between the first member and the second member; and the third member prevents entry of a heat of radiation and allows gas molecules to flow inside the thermal shield.

4. The cryopump as claimed in claim 3, wherein the cryocooler is connected to a side part of the thermal shield.

5. The cryopump as claimed in claim 2, wherein the cryocooler is connected to a side part of the thermal shield.

6. The cryopump as claimed in claim 1, wherein a third member is provided between the first member and the second member; and the third member prevents entry of a heat of radiation and allows gas molecules to flow inside the thermal shield.

7. The cryopump as claimed in claim 6, wherein the cryocooler is connected to a side part of the thermal shield.

8. The cryopump as claimed in claim 1, wherein the cryocooler is connected to a side part of the thermal shield.

9. A sputtering apparatus, comprising:
a sputtering device; and
a cryopump operably connected to the sputtering device and including:
a thermal shield having a first condensing panel; and
a cryocooler connected to the thermal shield;
wherein the thermal shield is divided into a plurality of members including a first member fabricated from a single first material and a second member fabricated from a single second material different from the first material;
the first member forms a thermal path between the first condensing panel and the cryocooler;
the second member does not form the thermal path;
the first material having a thermal conductivity higher than the second material and the first material has a higher heat capacity than the second material.

10. A semiconductor manufacturing apparatus, comprising:

a semiconductor manufacturing device; and a cryopump operably connected to the semiconductor manufacturing device and including:

a thermal shield having a first condensing panel; and a cryocooler connected to the thermal shield;

wherein the thermal shield is divided into a plurality of members including a first member fabricated from a single first material and a second member fabricated from a single second material different from the first material;

the first member forms a thermal path between the first condensing panel and the cryocooler;

the second member does not form the thermal path;

the first material has a thermal conductivity higher than the second material and the first material has a higher heat capacity than the second material.

\* \* \* \* \*